United States Patent
Ohtsuki

(10) Patent No.: US 9,780,006 B2
(45) Date of Patent: Oct. 3, 2017

(54) METHOD FOR EVALUATING SOI SUBSTRATE

(71) Applicant: SHIN-ETSU HANDOTAI CO., LTD., Tokyo (JP)

(72) Inventor: Tsuyoshi Ohtsuki, Annaka (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 0 days.

(21) Appl. No.: 15/305,989

(22) PCT Filed: Feb. 25, 2015

(86) PCT No.: PCT/JP2015/000943
§ 371 (c)(1),
(2) Date: Oct. 21, 2016

(87) PCT Pub. No.: WO2015/173995
PCT Pub. Date: Nov. 19, 2015

(65) Prior Publication Data
US 2017/0047258 A1    Feb. 16, 2017

(30) Foreign Application Priority Data

May 14, 2014   (JP) .................................. 2014-100758

(51) Int. Cl.
*H01L 27/12* (2006.01)
*H01L 21/66* (2006.01)
(Continued)

(52) U.S. Cl.
CPC ............... *H01L 22/14* (2013.01); *H01L 21/02* (2013.01); *H01L 23/66* (2013.01); *H01L 27/12* (2013.01); *H01L 27/1203* (2013.01)

(58) Field of Classification Search
CPC ..... H01L 22/14; H01L 23/66; H01L 27/1203; H01L 27/12; H01L 21/02
See application file for complete search history.

(56) References Cited

U.S. PATENT DOCUMENTS

2008/0054920 A1*   3/2008   Ohtsuki ............. G01R 31/2648
                                                      324/750.04
2010/0314722 A1    12/2010   Ishizuka et al.

FOREIGN PATENT DOCUMENTS

JP        2006-013100 A       1/2006
JP        2007-507093 A       3/2007
(Continued)

OTHER PUBLICATIONS

May 19, 2015 International Search Report issued in International Patent Application No. PCT/JP2015/000943.

(Continued)

*Primary Examiner* — Kyoung Lee
(74) *Attorney, Agent, or Firm* — Aaron L. Webb

(57) ABSTRACT

An SOI substrate evaluating method includes: forming a device onto a measuring SOI substrate, and previously determining a relationship between an interface state density and a leakage power upon application of radio-frequency thereon, or converting the interface state density to a resistance followed by previously determining a relationship between the converted resistance and the leakage power; measuring an interface state density of the evaluation target SOI substrate to determine the interface state density or a resistance converted from the interface state density; evaluating a leakage power of the evaluation target SOI substrate from the measured interface state density of the evaluation target SOI substrate on the basis of the determined relationship between the interface state density and the leakage power, or from a resistance converted from the measured interface state density of the evaluation target SOI substrate on the basis of the determined relationship between the resistance and leakage power.

1 Claim, 3 Drawing Sheets

(51) Int. Cl.
    *H01L 21/02* (2006.01)
    *H01L 23/66* (2006.01)

(56) References Cited

FOREIGN PATENT DOCUMENTS

| JP | 2007-507100 A | 3/2007 |
| JP | 2008-033946 A | 2/2008 |
| JP | 2009-231376 A | 10/2009 |
| WO | 2005/031842 A2 | 4/2005 |
| WO | 2005/031853 A1 | 4/2005 |

OTHER PUBLICATIONS

Lederer et al. "Effective Resistivity of Fully-Processed SOI Substrates", Solid-State Electronics, vol. 49, pp. 491-496, 2005.
Schroder. Semiconductor Material and Device Characterization, pp. 230-231, 2006.
Hovel. "Si Film Electrical Characterization in SOI Substrates by the HgFET Technique", Solid-State Electronics, vol. 47, pp. 1311-1333, 2003.

* cited by examiner

METHOD FOR EVALUATING SOI SUBSTRATE

TECHNICAL FIELD

The present invention relates to an SOI (Silicon On Insulator) substrate that is manufactured by bonding silicon single crystal wafers to each other, and more particularly to an evaluation of an SOI substrate used for producing a radio-frequency device, etc.

BACKGROUND ART

With rapid spread of mobile terminals and wireless communications, an RF (Radio-frequency) device primarily intended for a communication interface has attracted attention and it is considered to rapidly evolve in the future. In recent mobile terminals and personal computers, devices with low power consumption have been increasingly adopted. In such cases, using an SOI substrate provides a merit of a reduction in power consumption due to a decrease in leak current. Further, using SoC (System on a Chip) or the like to incorporate the RF device is also considered, and using an SOI wafer can provide a merit of reducing crosstalk between devices in terms of characteristics of an RF transistor.

Here, the crosstalk means propagation of an undesired electrical signal between devices, and the signal is propagated through a capacitor between wiring lines of devices or through a wafer, for example. Although the crosstalk is reduced as a resistivity of the wafer is increased, a wafer resistivity of a device forming portion cannot be actually extremely increased.

However, when the SOI wafer is used, since a buried oxide film layer (a BOX layer) is present between the SOI layer and the base wafer, the crosstalk can be reduced. Furthermore, since a device is not formed on the base wafer serving as an underlying layer of the BOX layer, a high-resistance base wafer can be used without being subject to limitation of device formation, thereby improving RF characteristics.

However, when the high-resistance base wafer is used, electric field can be applied to the BOX layer depending on an arrangement of sources/drains and other electron circuits produced on the SOI layer to generate a inversion layer on an interface between the BOX layer and the base wafer. In such a case, a desired radio-frequency characteristic cannot be obtained in spite of using a high-resistance wafer, since the radio-frequency characteristic is adversely affected. It is to be noted that as the high-resistance, a substrate of 1000 Ω·cm or more is generally used in many cases.

As a countermeasure, it is considered that the degradation of radio-frequency characteristics due to the inversion layer can be prevented by increasing an interface state density (hereinafter, also referred to as Dit) to trap carriers in an interface state.

As such a technology, for example, it has been known a technology that introduces an intermediate layer (a trap layer) such as a polysilicon layer or a nitride oxide to an interface between a BOX layer and a base wafer, and can obtain an SOI wafer with good radio-frequency characteristics thereby so as not to form a inversion layer (see, e.g., Patent Documents 1 and 2, Non-Patent Document 1).

It has been also introduced a method in which a silicon wafer having the plane orientation different from the silicon wafer to be an SOI layer is used as a base wafer to prevent deterioration of radio-frequency characteristics (e.g., Patent Document 3).

The foregoing technologies are essential to obtain good radio-frequency characteristics. In evaluating the technologies, substrate resistance can be measured by a method such as a spreading resistance measurement and so on, for example. However, there is not an evaluation method to directly measure characteristics of a trap layer (a functional layer) immediately under a BOX layer. Accordingly, there has been a problem that the radio-frequency characteristics can be evaluated only by a method in which an actual device is produced to measure a leakage power, etc.

CITATION LIST

Patent Literature

Patent Document 1: Japanese Unexamined Patent publication (Kohyou) No. 2007-507093
Patent Document 2: Japanese Unexamined Patent publication (Kohyou) No. 2007-507100
Patent Document 3: Japanese Unexamined Patent publication (Kokai) No. 2009-231376

Non-Patent Literature

Non-Patent Document 1: D. Lederer et. al., "Effective resistivity of fully-processed SOI substrates" Solid-State Electronics, 49, 491 (2005).
Non-Patent Document 2: SEMICONDUCTOR MATERIAL AND DEVICE CHARACTERZATION, D. K. Schroder, JOHN WILEY & SONS, INC., PUBLICATION 2006
Non-Patent Document 3: H. J. Hovel, "Si film electrical characterization in SOI substrates by the HgFET technique", Solid-State Electron, 47, 1311 (2003)

SUMMARY OF INVENTION

Technical Problem

The present invention was accomplished in view of the above-described problems. It is an object of the present invention to provide a method for evaluating an SOI substrate suited for a radio-frequency device in a simpler manner as possible without forming a device actually for measuring radio-frequency characteristics.

Solution to Problem

To solve the problems described above, the present invention provides a method for evaluating a radio-frequency characteristic of an evaluation target SOI substrate upon application of radio-frequency, comprising the steps of:
forming a device onto a measuring SOI substrate, and on the measuring SOI substrate, previously determining a relationship between an interface state density and a leakage power upon application of radio-frequency, or converting the interface state density to a resistance followed by previously determining a relationship between the converted resistance and the leakage power;
measuring an interface state density of the evaluation target SOI substrate to determine the interface state density or a resistance converted from the interface state density;
evaluating a leakage power of the evaluation target SOI substrate from the measured interface state density of the evaluation target SOI substrate on the basis of the previously determined relationship between the interface state density and the leakage power, or from a resistance converted from the measured interface state density of the evaluation target SOI substrate on the basis of the previously determined relationship between the resistance and the leakage power.

By such a method, it is possible to simply evaluate an SOI substrate suited for a radio-frequency device in a stage of an SOI substrate not to measure the radio-frequency characteristics after forming a device actually.

Advantageous Effects of Invention

As described above, the present invention makes it possible to simply evaluate an SOI substrate whether it is suitable for a radio-frequency device or not without producing an actual device. This can be converted to a resistance, which is common as a specification of a wafer, and can be defined by a simple value in terms of the resistance as an indicator.

DESCRIPTION OF EMBODIMENTS

Hereinafter, the present invention will be described in detail, but the present invention is not limited thereto.

First Embodiment

The first embodiment involves the first step of previously determining a relationship between an interface state density and a leakage power upon application of radio-frequency by using a measuring SOI substrate.

Figure 1:
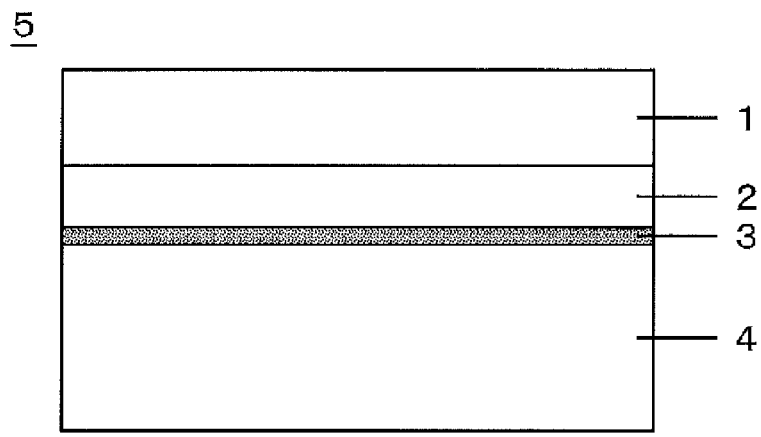
FIG. 1 is a schematic diagram showing an example of an SOI substrate for measurement and evaluation in the present invention.

The measuring SOI substrate to be prepared includes the one same with an evaluation target SOI substrate 5 having an SOI layer 1, a BOX layer 2 of a silicon oxide film, a base wafer 4, and a trap layer 3, which suppresses generation of a carrier at the interface of the BOX layer 2 and the base wafer 4, as shown in FIG. 1.

Then, an interface state density of the measuring SOI substrate 5 is measured to determine the interface state density. It is to be noted that the measurement of the interface state density can be performed by a pseudo MOSFET method using a mercury electrode described in Non-Patent Documents 2 and 3. Alternatively, the interface state density can be measured by a CV method described in Non-Patent Document 2 after removing the SOI layer with an alkaline solution.

On the measuring SOI substrate, radio-frequency is also applied after forming a device, and a leakage power at that time is measured.

By using the interface state density and leakage power upon application of radio-frequency of the SOI substrate 5 measured as described above, a relationship between them is previously determined.

Then, the next step is performed to measure an interface state density of an evaluation target SOI substrate to determine the interface state density.

In the beginning, the evaluation target SOI substrate is prepared. The evaluation target SOI substrate, too, is the SOI substrate 5 having an SOI layer 1, a BOX layer 2, a trap layer 3, and a base wafer 4 as shown in FIG. 1. An interface state density of this evaluation target SOI substrate 5 is measured to determine the interface state density. It is to be noted that the interface state density can be measured by a pseudo MOSFET method using a mercury electrode or a CV method as described above.

Subsequently, a step of evaluating a leakage power of the evaluation target SOI substrate is performed.

As described above, the leakage power of the evaluation target SOI substrate can be estimated and evaluated from the measured interface state density of the evaluation target SOI substrate on the basis of the previously determined relationship between the interface state density and the leakage power on the measuring SOI substrate.

In this way, the present invention makes it possible to evaluate the leakage power, that is radio-frequency characteristics, of an SOI substrate without producing a device actually onto the evaluation target SOI substrate.

Second Embodiment

The second embodiment involves the first step of previously determining a relationship between a converted resistance, which is based on a measurement result of an interface state density of a measuring SOI substrate, and a leakage power.

The interface state density can be converted to the resistance by the following method.

Figure 5:
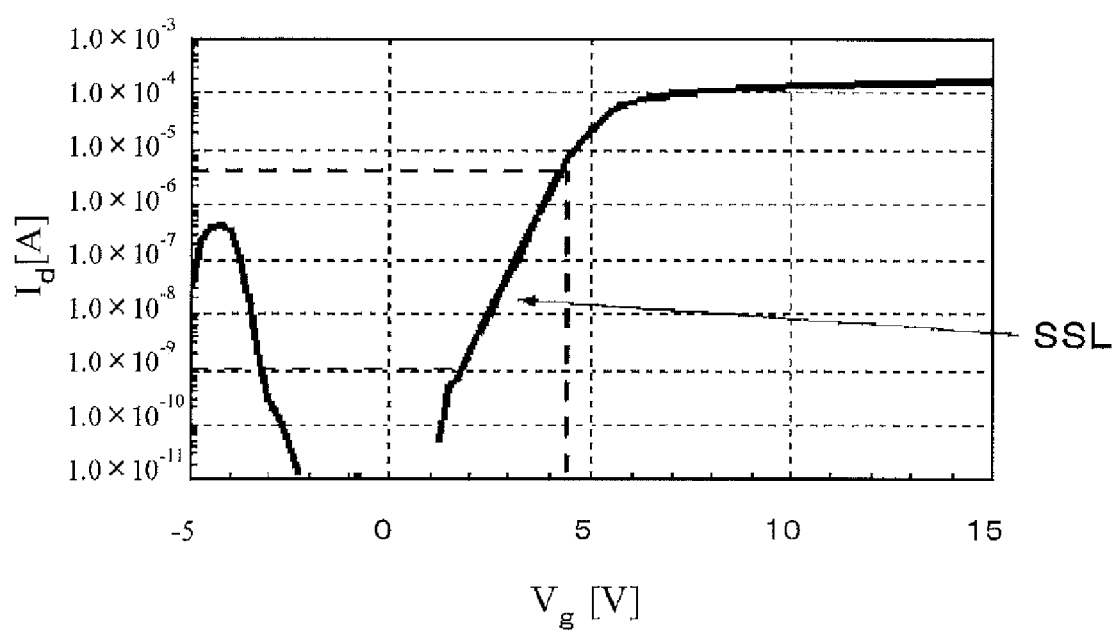
FIG. 5 is a figure showing an example of calculating an interface state density by a pseudo MOSFET in the present invention.

On the basis of a relationship of Equation 1, the value of SSL (Subthreshold Slope) can be determined from the interface state density. In this case, SSL is defined as voltage ($V_g$) change when the current ($I_d$) increases one order of magnitude as shown in FIG. 5. Incidentally, $C_{ox}$ represents a BOX layer capacity, and $C_{si}$ represents an SOI layer capacity.

This SSL is defined as a resistance RD (which corresponds to V/I of a resistance component in Equation 2) determined from the interface state density. Then, this resistance RD is converted to an ordinal resistance. The scaling factor in this conversion can be determined previously from the results of radio-frequency measurement (Equations 2 and 3). Incidentally, ρ represents a resistivity, and $R_{SP}$ represents a spreading resistance.

$$Dit = \left[\frac{SSL}{\ln 10}\left(\frac{q}{kT} - \frac{1}{E_F T_{Si}}\right)C_{ox} - (C_{ox} + C_{Si})\right]\Big/ q \quad \text{[Equation 1]}$$

$$\approx \frac{SSL\, 16.77\, C_{ox} - (C_{ox} + C_{Si})}{q}$$

(temperature 300 K)

-continued $$\rho = 2\pi s F \frac{V}{I} \quad \text{[Equation 2]}$$

s: distance between the probes
F: correction factor $$Rsp = \frac{\rho}{4r} \quad \text{[Equation 3]}$$

r: radius of the tip of the probe

On the measuring SOI substrate, radio-frequency is also applied after forming a device, and a leakage power at that time is measured.

In this manner, by using the resistance converted from the measurement result of an interface state density and leakage power upon application of radio-frequency determined by measurement, a relationship between them is previously determined.

From the resistance converted from the measured interface state density of the evaluation target SOI substrate, a leakage power of the evaluation target SOI substrate is evaluated on the basis of the previously determined relationship between the resistance and the leakage power.

In this case, the interface state density of the evaluation target SOI substrate is measured, and the obtained interface state density is converted to a resistance in the same manner as described above.

In this manner, the leakage power of the evaluation target SOI substrate can be estimated and evaluated from the resistance converted from the interface state density of the evaluation target SOI substrate on the basis of the previously determined relationship between the resistance and the leakage power on the measuring SOI substrate.

As described above, the present invention makes it possible to evaluate the leakage power of an SOI substrate without producing a device actually onto the evaluation target SOI substrate. It is also possible to indicate the substrate characteristics by one criterion of a resistance since the interface state density is converted to the resistance.

EXAMPLE

Hereinafter, the present invention will be described in more detail with reference to Examples, but the present invention is not limited thereto.

A silicon single crystal wafer doped with boron having a diameter of 200 mm and a resistivity of 1000 Ω·cm was used as a base wafer. To this base wafer, 3 μm of a polycrystalline layer was grown by using trichlorosilane as a raw material gas at 1150° C. for a growth time of 3 minutes. Subsequently, 0.5 μm of a polycrystalline layer was grown by using monosilane as a raw material at 570° C. for a growth time of 90 minutes to form a trap layer.

This wafer was bonded with a bond wafer, in which a silicon wafer doped with boron having a diameter of 200 mm and a resistivity of 1000 Ω·cm had been treated at 1150° C. in a Pyro atmosphere for 6 hours to form 1000 nm of an oxide film as a BOX layer, and was subjected to bonding heat treatment. Then, this was reduced the film thickness by polishing to produce an SOI substrate so as to have a 160 nm SOI layer. In the same manner, plural SOI substrates were produced.

These SOI substrates were treated at 450° C. in a nitrogen atmosphere containing 1% of hydrogen with varying the annealing time from 5 minutes to 30 minutes to produce plural SOI substrates with the interface state density between the BOX layer and the base wafer being varied.

On these plural SOI substrates with the interface state density being varied, each interface state density was measured by a pseudo MOSFET method using a mercury electrode described in Non-Patent Documents 2 and 3.

Subsequently, the SOI layer of each SOI substrate was removed by alkaline etching, and then Al was deposited thereto with a thickness of 2 μm in order to measure the leakage power. Further, photolithography was performed to form a CPW (Coplanar Waveguides).

In the device for measuring the leakage power, Al electrodes of 150 μm×50 μm were formed on the measuring SOI substrate so as to have distance of 100 μm between the electrodes.

Figure 3:
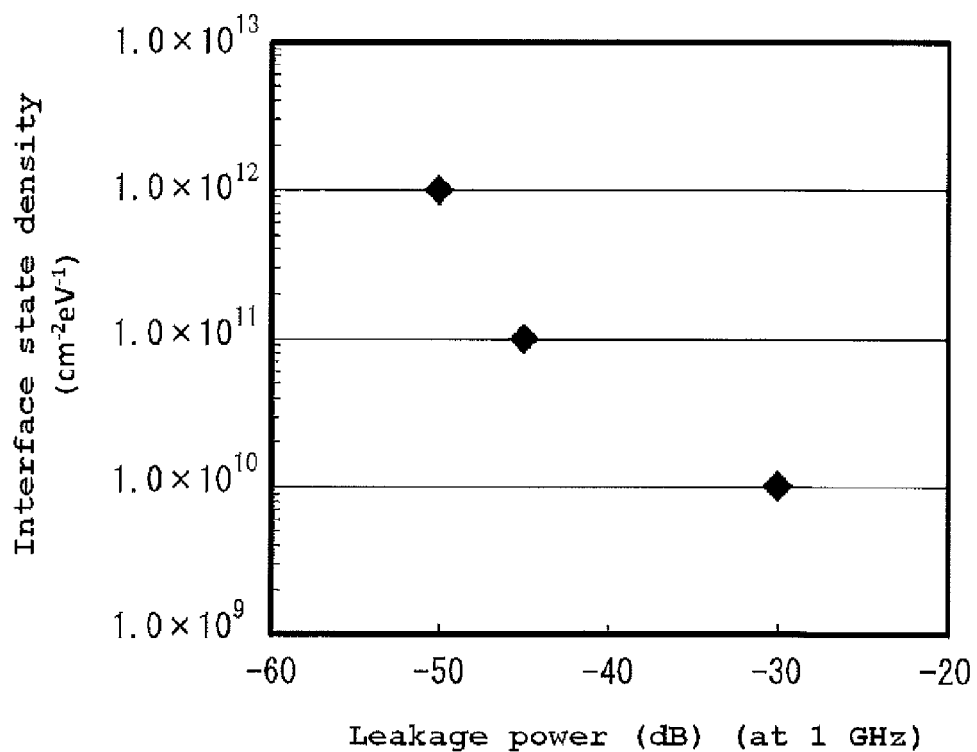
FIG. 3 is a figure showing an example of a relationship between an interface state density and a leakage power upon application of radio-frequency on a measuring SOI substrate, which is previously determined in the present invention.

Then, radio-frequency was applied to the measuring SOI substrate with the device formed thereon, and the leakage power between the Al electrodes to the input power was measured. The measurement was performed by applying each radio-frequency with a frequency in a range of $1 \times 10^8$ to $1 \times 10^{11}$ Hz. From the data of frequency-dependence of the leakage power, values at 1 GHz ($1 \times 10^9$ Hz), which appeared to clearly reflect the difference of substrates, were adopted as representatives of the leakage power to determine a relationship in FIG. 3.

On the basis of the determined interface state densities measured as described above converted resistances were determined.

In this case, the capacity Csi of the 501 layer with a thickness of 160 nm comes to be $6.53 \times 10^{-8}$ F, the capacity Cox of the BOX layer with a thickness of 1000 nm comes to be $7.195 \times 10^{-8}$ F. From Equation 1, it was determined that SSL is 0.15 when the interface state density is $1 \times 10^{12}$ cm$^{-2}$ eV$^{-1}$, SSL is 0.015 when the interface state density is $1 \times 10^{11}$ cm$^{-2}$ eV$^{-1}$, and SSL is 0.0015 when the interface state density is $1 \times 10^{10}$ cm$^{-2}$ eV$^{-1}$.

Figure 4:
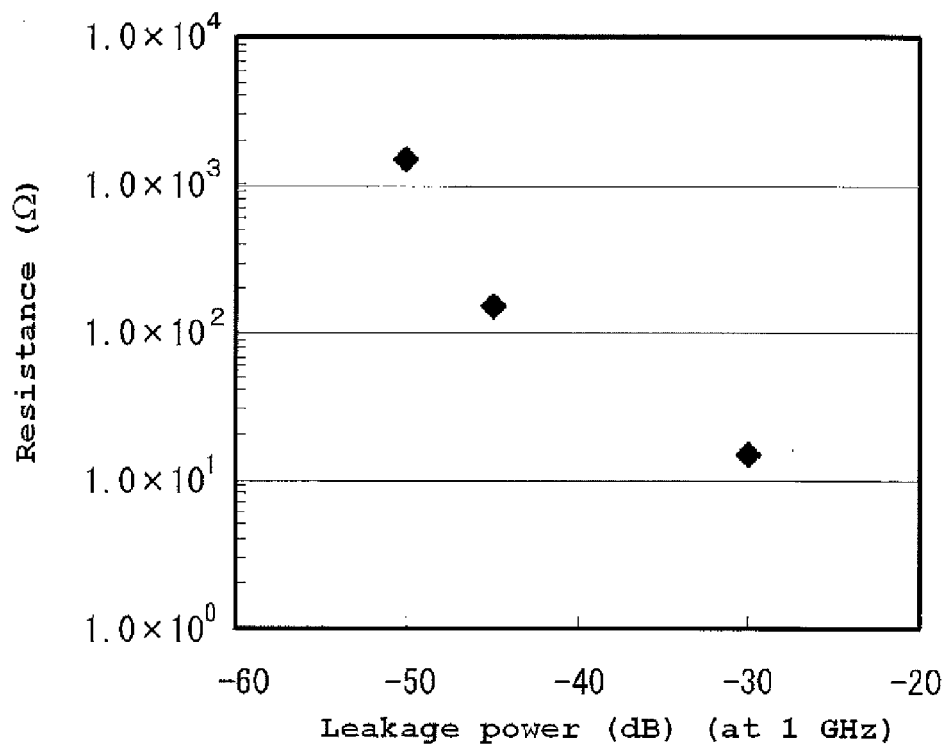
FIG. 4 is a figure showing an example of a relationship between a converted resistance and a leakage power, which is previously determined in the present invention with the interface state density being converted to the resistance.

Furthermore, the SSL was converted to a resistance with the coefficient to convert the SSL into the resistance being set to 10000 in this case on the basis of the relationship with radio-frequency characteristics. In this manner, on the basis of interface state densities of the BOX layer and the base wafer measured when 1 GHz was applied, each converted resistance was determined. Then, the relationship between the converted resistance and the leakage power was determined and shown in FIG. 4.

Subsequently, an evaluation target SOI substrate was prepared in the same manner as described above. On the evaluation target SOI substrate, the interface state density was measured by a pseudo MOSFET method. From the measured interface state density, the leakage power of the evaluation target SOI substrate upon application of radio-frequency could be evaluated on the basis of the previously determined relationship between the interface state density and the leakage power in FIG. 3.

On the basis of the measured interface state density of the evaluation target SOI substrate, the converted resistance was determined in the same manner as described above. From the converted resistance, the leakage power of the evaluation target SOI substrate upon application of radio-frequency could be evaluated on the basis of the previously determined relationship between the resistance and the leakage power in FIG. 4.

Figure 2:
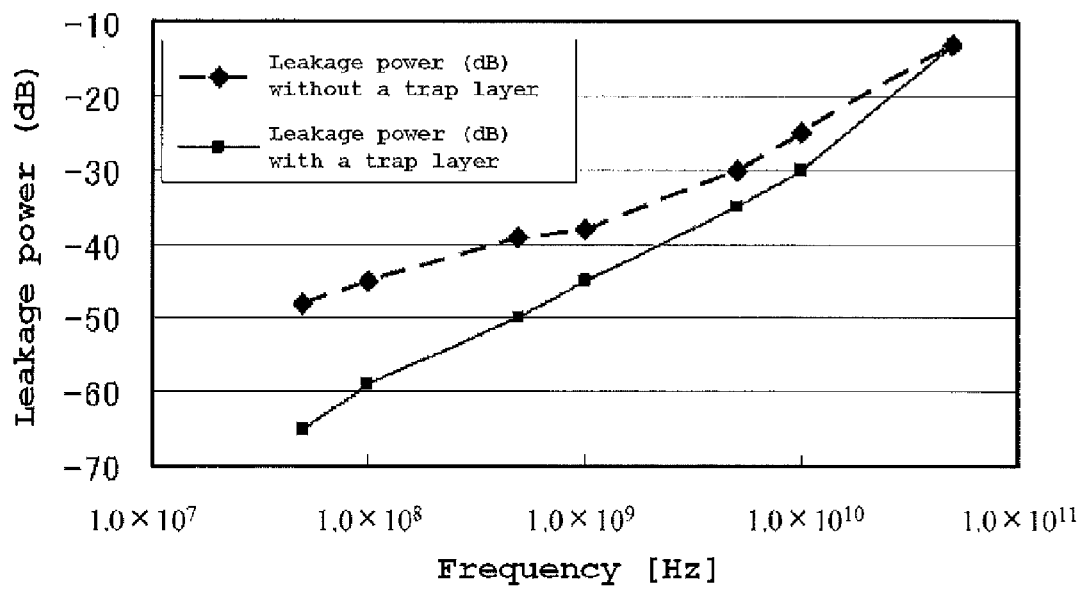
FIG. 2 is an example comparing an existence or nonexistence of a trap layer immediately under a BOX layer in an SOI substrate.

As described above, the relationship between an interface state density and a leakage power or the relationship between a resistance and a leakage power were previously determined, which made it possible to estimate and correctly evaluate the difference of leakage powers due to the difference of existence or nonexistence of a trap layer and so on as shown in FIG. 2 from the interface state density of the evaluation target SOI substrate or the resistance converted from the interface state density without forming a device by using these relationships. As a result, it has become possible to perform a correct evaluation in a convenient method.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A method for evaluating a radio-frequency characteristic of an evaluation target SOI substrate upon application of radio-frequency, comprising the steps of:

forming a device onto a measuring SOI substrate, and on the measuring SOI substrate, previously determining a relationship between an interface state density and a leakage power upon application of radio-frequency, or converting the interface state density to a resistance followed by previously determining a relationship between the converted resistance and the leakage power;

measuring an interface state density of the evaluation target SOI substrate to determine the interface state density or a resistance converted from the interface state density;

evaluating a leakage power of the evaluation target SOI substrate from the measured interface state density of the evaluation target SOI substrate on the basis of the previously determined relationship between the interface state density and the leakage power, or from a resistance converted from the measured interface state density of the evaluation target SOI substrate on the basis of the previously determined relationship between the resistance and the leakage power.

\* \* \* \* \*